(12) United States Patent
Gonin et al.

(10) Patent No.: US 8,137,902 B2
(45) Date of Patent: Mar. 20, 2012

(54) METHOD OF MANUFACTURING MECHANICAL AND MICROMECHANICAL PARTS

(75) Inventors: Yvan Gonin, Les Ponts-de-Martel (CH); Vittorio Emilio Marsico, Cressier (CH)

(73) Assignee: EM Microelectronic-Marin S.A., Marin (CH)

( * ) Notice: Subject to any disclaimer, the term of this patent is extended or adjusted under 35 U.S.C. 154(b) by 884 days.

(21) Appl. No.: 12/167,691

(22) Filed: Jul. 3, 2008

(65) Prior Publication Data
US 2009/0011373 A1 Jan. 8, 2009

(30) Foreign Application Priority Data
Jul. 3, 2007 (EP) ..................... 07111580

(51) Int. Cl.
*G03F 7/26* (2006.01)
(52) U.S. Cl. ..................... 430/323
(58) Field of Classification Search .................. 430/311, 430/322, 323
See application file for complete search history.

(56) References Cited

U.S. PATENT DOCUMENTS
2003/0205721 A1 11/2003 Nishii et al.
2006/0094246 A1* 5/2006 Whitefield et al. ............ 438/725
2007/0126035 A1* 6/2007 Ernst et al. .................... 257/288
2007/0264822 A1* 11/2007 Kubota et al. ................. 438/660
2008/0038856 A1* 2/2008 Nishii et al. .................... 438/38

FOREIGN PATENT DOCUMENTS
EP 1 722 281 A1 11/2006
WO WO 2005-041309 * 5/2005

OTHER PUBLICATIONS

English translation of WO 2005-041309, May 2005.*
Perret, Andre, "Le Silicum Comme Materiau dans la Fabrication de Pieces Mecaniques," Bulletin Societe Suisse de Chronometrie, No. 38, Nov. 9, 2001, pp. 27-29.
European Search Report issued in corresponding application No. EP 07 11 1580, completed Nov. 27, 2007 (noted as Nov. 27, 2008 on translation of search report).

* cited by examiner

*Primary Examiner* — Kathleen Duda
*Assistant Examiner* — Brittany Raymond
(74) *Attorney, Agent, or Firm* — Griffin & Szipl, P.C.

(57) ABSTRACT

A method of manufacturing parts of a first material able to be etched from a substrate including at least one superficial layer of the first material, includes (a) forming a substantially uniform superficial layer of a second material at the surface of the superficial layer of the first material, wherein the second material resists a selective etch of the first material, (b) forming a bead of second material at the periphery of the superficial layer of second material, (c) structuring the layer of second material and the bead by a photolithographic process including an etch step of sufficient duration to etch the superficial layer of second material over the entire thickness thereof, but insufficient to etch the bead over the entire thickness thereof, so as to obtain a mask, and (d) cutting out parts made of the first material through the mask of the second material, by directional etching.

13 Claims, 3 Drawing Sheets

METHOD OF MANUFACTURING MECHANICAL AND MICROMECHANICAL PARTS

This application claims priority from European Patent Application No. 07111580.2 filed Mar. 7, 2007, the entire disclosure of which is incorporated herein by reference.

FIELD OF THE INVENTION

The invention relates to the microtechnical field. It concerns more specifically a method of manufacturing mechanical or micromechanical parts made of silicon or any other material compatible with semiconductor manufacturing technology.

BACKGROUND OF THE INVENTION

Those skilled in the art know silicon mechanical or micromechanical parts. These are, for example, timepiece parts such as wheels, hands, balance springs, levers or any other essentially flat part. These parts have interesting mechanical properties, such as good resistance to wear or a low friction coefficient. They are generally manufactured from silicon on insulator type substrates, formed of a silicon wafer, an embedded insulating layer such as an oxide or sapphire layer, and a superficial silicon layer with a thickness of several tens to several hundreds of microns. Manufacture includes several steps implementing processes developed for the integrated circuit industry. These processes are for making parts with complex shapes in the plane, with greater precision than the precision obtained by stamping.

The main manufacturing steps for a mechanical silicon part from a substrate including a superficial silicon layer, of the "silicon-on-insulator" type, are schematically illustrated in FIG. 1. In order to facilitate the diagram and the reading thereof, scale has deliberately not been respected.

FIG. 1a: A substrate 10 formed of a silicon wafers 12, of an oxide embedded layer 14 and a superficial silicon layer 16, is oxidised on its entire face A superficial oxide layer 18, extending over the entirety of the superficial silicon layer 16 and typically having a substantially uniform thickness of 1 micron, is thus obtained. The oxidisation method is generally a wet or dry thermal method. In a variant, this could be an oxidisation by deposition method, of the physico-chemical type, such as a plasma enhanced chemical vapour deposition.

FIG. 1b: The superficial oxide layer 18 is structured by photolithography so as to form an oxide mask 20. This structuring step includes a first sub-step of layering a photosensitive resin, a second sub-step of local exposure of the resin to ultraviolet rays, a third sub-step of hardening the resin, a fourth sub-step of developing the resin, a fifth sub-step of etching the oxide through the resin mask, by a wet or dry process, then a sixth sub-step of cleaning the resin. All of these sub-steps are conventional, and will not be described in detail, since they are well known to those skilled in the art.

It will be noted that the resin layering sub-step ends in an operation of removing the resin on the periphery of the superficial oxide layer 18. This operation is achieved in particular by using a jet of solvent directed at the edge of substrate 10, over a width of 2 to 5 millimeters. It has the effect of exposing the periphery of the superficial oxide layer 18 for the etch, and thus of stripping off the periphery of superficial silicon layer 16, at the end of etching. Substrate 10 thus has, after mask 20 has been formed, a central zone 21 essentially covered with oxide, and a peripheral zone 22, from which the silicon is stripped away.

The operation of removing the resin from the periphery of the substrate is conventional within the field of integrated circuit manufacture. The purpose thereof is to remove from this zone, all of the deposited layers, in order to prevent the formation of an edge bead formed of the stack of various layers. This type of bead is the cause of problems of pealing, short-circuits, gripping and maintaining substrates.

The operation of removing resin from the periphery of the substrate is not necessary in mechanical part manufacture. Indeed, the number of manufacturing steps is, in such case, reduced and does not give rise to the formation of a bead. However, the resin removal operation cannot easily be omitted for the following reasons. Mechanical silicon parts are generally manufactured in integrated circuit manufacturing lines. The methods used are suited for manufacturing integrated circuits, and it is time-consuming and expensive to alter such methods when dealing with batches of mechanical parts. Moreover, the presence of resin on the periphery of the substrates raises serious contamination problems. Indeed, contact with the substrate gripping devices occurs via the periphery of the substrate. If the latter is covered with resin, the gripping device becomes loaded with resin and the latter gradually accumulates until it becomes unstuck and is deposited indiscriminately on the substrates. The parts contaminated by the resin are defective and have to be rejected. For these reasons, the resin removal operation is obligatory at the end of the resin layering, for batches of mechanical parts, just as for batches of integrated circuits.

FIG. 1c: The superficial silicon layer 16 is etched through the oxide mask 20, as far as the embedded oxide layer 14, so as to form mechanical silicon parts 24, including a top face 26, a flank 28 and a bottom face 30. At this stage of manufacture, top and bottom faces 26 and 30 are still secured respectively to superficial oxide layer 18 and embedded oxide layer 14.

The etch method used for etching the superficial silicon layer is highly selective, i.e., it etches the silicon strongly and the oxide weakly, so that definition of the silicon parts is optimum. It is also highly anisotropic, i.e., able to etch superficial silicon layer 16 perpendicular to the plane of substrate 10 and not parallel thereto. An anisotropic etch is indispensable for flanks 28 of mechanical parts 24 to be perpendicular to their top and bottom faces 26 and 30.

This selective and anisotropic etch method is generally of the physico-chemical type. Reactive ion etching is the most frequently used. This is a plasma assisted gas phase etch. The gas is generally a fluorinated gas, like $SF_6$, $CF_4$ or $CHF_3$. The effect of the plasma is to create reactive species and to accelerate them perpendicularly to substrate 10. In FIG. 1c, the plasma is represented by arrows directed perpendicular to substrate 10, referenced 30.

In the standard mechanical part manufacturing method, the stripped off peripheral silicon zone 22 is exposed to plasma 30 for the whole of the etch. This zone 22 forms, opposite plasma 30, a chemical discontinuity relative to central zone 21, covered in oxide. An inhomogeneity in plasma 30 is then created in proximity to the transition between central zone 21 and peripheral zone 22. The effect of this local inhomogeneity is to interfere with the etch in proximity to peripheral zone 22, and in particular the anisotropic nature thereof. It will be observed that the mechanical parts 24 located in proximity to peripheral zone 22, have flanks 28 that are not perpendicular to the top and bottom faces 26 and 30, but oblique, either recessed in or opening out these parts have to be rejected because they are liable to wear prematurely and in a non uniform manner. Eventually, this wear could cause a violent rupture of the part.

FIG. 1*d*: The top 18 and embedded 14 oxide layers are removed by wet means, generally by etching in a concentrated hydrofluoric acid bath. Silicon parts 24 are thus released from substrate 10.

The method of manufacturing silicon mechanical parts thus described, is the state of the art method. It leads to the rejection of peripheral parts that constitute a percentage of the order of 10 to 30 percent of the total number of parts, depending upon the size of the parts.

SUMMARY OF THE INVENTION

It is an object of the present invention to overcome this rejection problem encountered in the prior art method, simply and efficiently. More specifically, the present invention concerns a method of manufacturing parts of a first material able to be etched, from a substrate including at least one superficial layer of the first material. According to a first embodiment of the invention, this method includes the following steps:

(a) forming a substantially uniform superficial layer of a second material at the surface of the superficial layer of the first material, wherein the second material is able to resist a selective etch of the first material, (b) forming a bead of the second material at the periphery of the superficial layer of the second material, (c) structuring the layer of second material and the bead by a standard photolithographic process including an etch step of sufficient duration to etch the superficial layer of second material over the entire thickness thereof, but insufficient to etch the bead over the entire thickness thereof, so as to obtain a mask of the second material extending as far as the periphery of the layer of first material, and (d) cutting out the parts made of the first material through the mask of the second material, by directional etching.

Because of this step of forming a bead of second material at the edge of the substrate, the mask of the second material extends as far as the periphery of the superficial layer of the first material, such that the inhomogeneity of the plasma is removed.

In accordance with a second embodiment of the present invention, the first embodiment is modified so that the first material is silicon. In accordance with a third embodiment of the present invention, the first embodiment is modified so that the second material is oxide. In accordance with a fourth embodiment of the present invention, the second and third embodiments are further modified so that the superficial oxide layer is formed at the surface of the superficial silicon layer by a full oxidation method of the superficial silicon layer. In accordance with a fifth embodiment of the present invention, the fourth embodiment is further modified so that the oxidation method is a thermal method.

In accordance with a sixth embodiment of the present invention, the fourth embodiment and the fifth embodiment are further modified so that the oxide bead at the periphery of the superficial oxide layer is formed by a selective oxidation method of the periphery of the superficial silicon layer. In accordance with a seventh embodiment of the present invention, the sixth embodiment is further modified so that the selective oxidation method of the periphery of the superficial silicon layer includes a step of applying a mask to a central zone of the superficial oxide layer, followed by a thermal oxidation step, wherein the mask is able to resist the thermal oxidation. In accordance with an eighth embodiment of the present invention, the seventh embodiment is further modified so that the mask is made by depositing a nitride layer on the superficial oxide layer, followed by the structuring of the nitride layer so as to remove the periphery of the nitride layer.

In accordance with a ninth embodiment of the present invention, the second embodiment is further modified so that the silicon parts are cut out by a plasma assisted etch method. In accordance with a tenth embodiment of the present invention, the first embodiment is modified so that the method further includes a step of separating the parts from the substrate.

DETAILED DESCRIPTION OF ONE EMBODIMENT OF THE INVENTION

Other features and advantages of the present invention will appear more clearly upon reading the following detailed description of an example embodiment of the manufacturing method according to the invention, this example being given purely by way of non limiting illustration, with reference to the annexed drawings, in which FIG. 2 shows schematically the main steps of a method of manufacturing silicon mechanical parts according to the invention, It will be noted that, as in FIG. 1, scale has deliberately not been respected, in order to facilitate reading and the diagram.

Figure 1A:
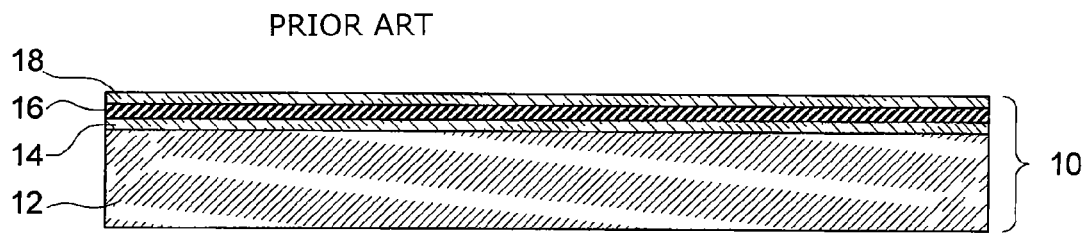
FIG. 1*a* illustrates one or more initial steps in a conventional manufacturing method for a mechanical silicon part from a substrate.
Figure 1B:
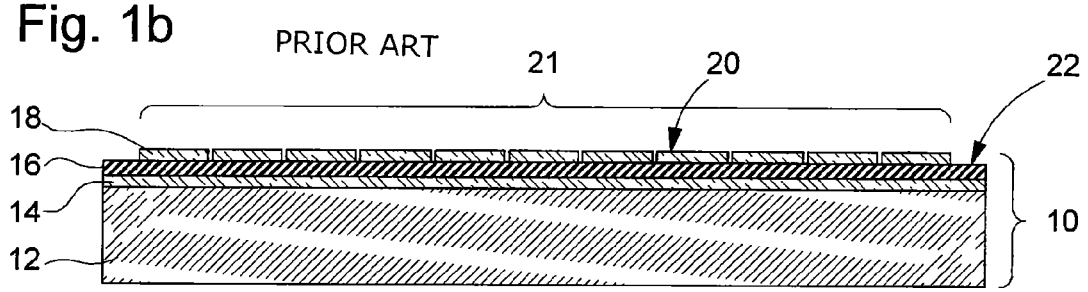
FIG. 1*b* illustrates one or more subsequent steps in a conventional manufacturing method for a mechanical silicon part from a substrate.
Figure 1C:
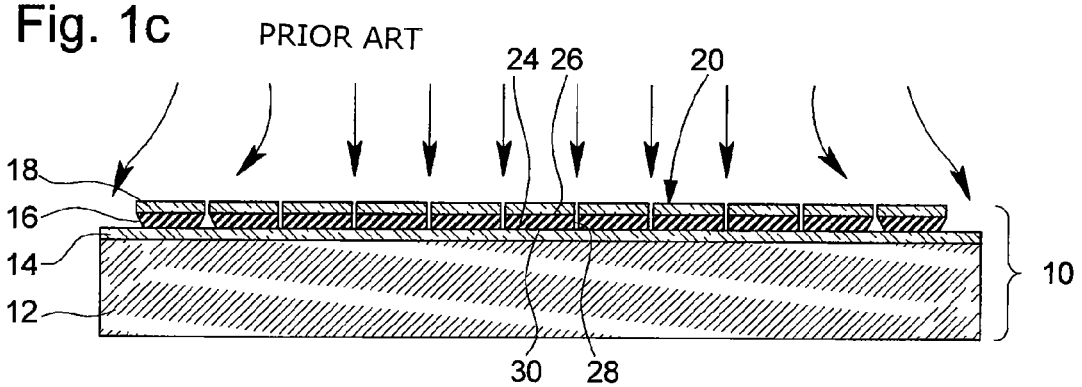
FIG. 1*c* illustrates one or more steps related to etching in a conventional manufacturing method for a mechanical silicon part from a substrate.
Figure 1D:
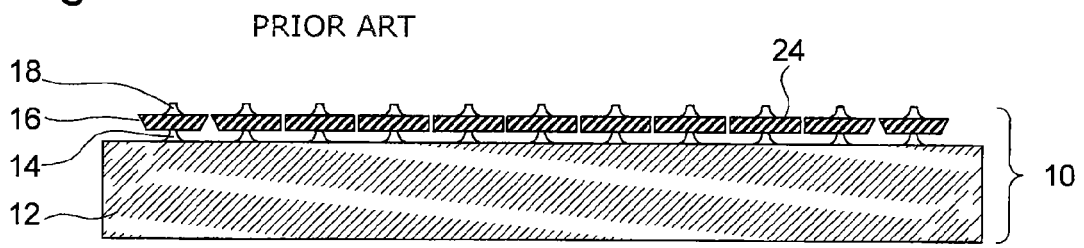
FIG. 1*d* illustrates one or more steps in a conventional manufacturing method for a mechanical silicon part from a substrate, which are performed after the steps shown in FIGS. 1*a*, 1*b* and 1*c*.
Figure 2A:
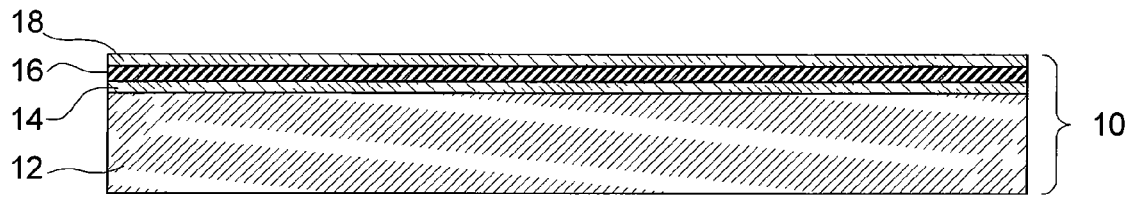
FIG. 2*a* illustrates one or more initial steps in the manufacturing method for a mechanical silicon part from a substrate, in accordance with the present invention.

FIG. 2*a*: A substrate 10 formed of a silicon plate 12, an embedded oxide layer 14 and a superficial silicon layer 10 is oxidised over its entire surface. A substantially uniform oxide superficial layer 18 extending over the entire superficial silicon layer 16 and having a thickness of 1 micron is thus obtained. This step is not different to first step of the prior art method shown in FIG. 1a.

Figure 2B:
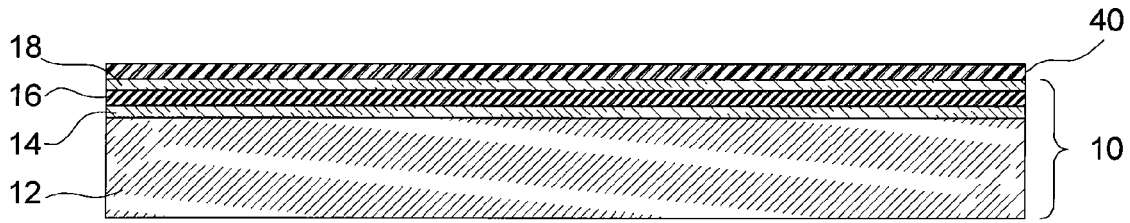
FIG. 2*b* illustrates one or more subsequent steps directed to depositing a layer of nitride in the manufacturing method in accordance with the present invention.

FIG. 2b: a layer of nitride 40 with a thickness of around 0.2 microns is deposited fully onto the superficial oxide layer 18. The method used is generally a low pressure chemical vapour deposition. In a variant, it could be a plasma enhanced chemical vapour deposition.

Figure 2C:
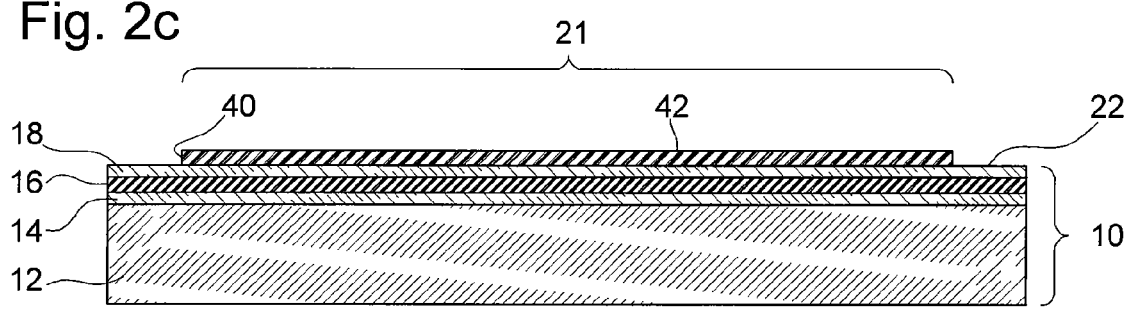
FIG. 2*c* illustrates one or more subsequent steps directed to structuring the nitride layer to form a mask in the manufacturing method in accordance with the present invention.

FIG. 2c: The nitride layer 40 is structured so as to form a mask 42 extending over the whole of the central zone 21 of substrate 10, and leaving peripheral zone 22 exposed. This structuring step includes a first photosensitive resin layering sub-step, a possible second sub-step of exposing the resin to ultraviolet rays, a third sub-step of hardening the resin, a fourth sub-step of nitride etching through the resin mask, by a wet or dry method, then a fifth sub-step of cleaning the resin. All of these sub-steps are conventional and will not be described in detail, since they are well known to those skilled in the art. It will be noted that the photosensitive resin layering sub-step conventionally ends in an operation of removing resin from the periphery of the nitride layer 40.

Figure 2D:
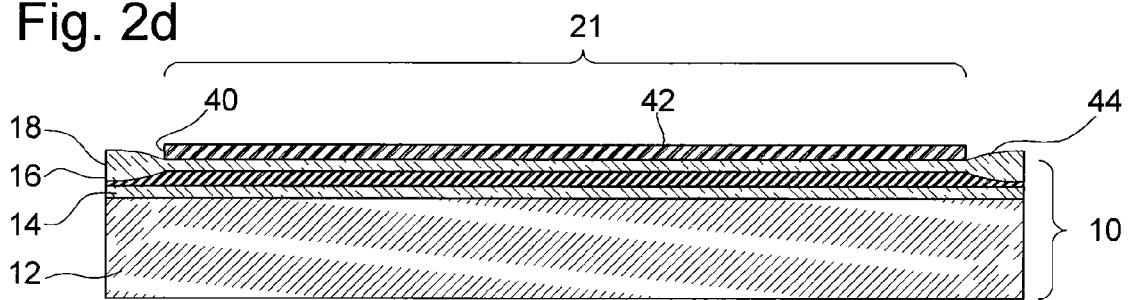
FIG. 2*d* illustrates one or more subsequent steps directed to oxidizing the structured nitride layer to form a mask in the manufacturing method in accordance with the present invention.

FIG. 2d: Substrate 10 thus covered with a superficial oxide layer 18 and a nitride mask 42, is oxidised. Oxidisation occurs selectively, i.e., it happens on peripheral zone 22 and not on central zone 21, because of the presence of the nitride mask 42, which blocks the oxidisation reaction where it covers the superficial oxide layer 18. The oxidisation process is of the thermal type, preferably wet. It gives rise to the formation of a peripheral oxide bead 44, with a thickness of 2 to 3 microns, i.e., around two to three times the thickness of superficial oxide layer 18, and with a thickness of 3 to 8 millimeters.

Figure 2E:
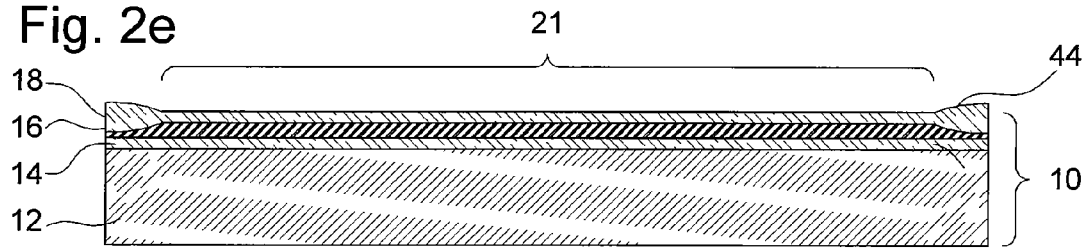
FIG. 2*e* illustrates one or more subsequent steps directed to removing the nitride layer mask in the manufacturing method in accordance with the present invention.

FIG. 2e: The nitride mask 42 is removed by chemical means, typically in an orthophosphoric acid. Substrate 10 is, at this stage, covered by the superficial oxide layer 18 and oxide bead 44.

Figure 2F:
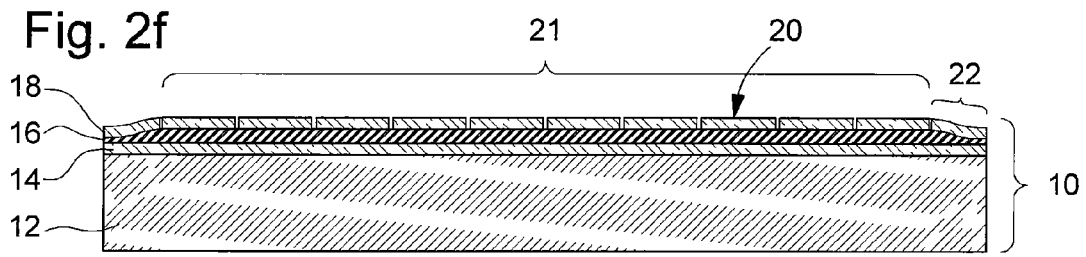
FIG. 2*f* illustrates one or more subsequent steps directed to structuring the superficial oxide layer to form an oxide mask in the manufacturing method in accordance with the present invention.

FIG. 2f: The superficial oxide layer 18 is structured by photolithography so as to form an oxide mask 20. This step is similar to the structuring step according to the state of the art shown in FIG. 1b, and includes the same sub-steps.

As in the standard method, the resin layer sub-step ends in an operation of removing the resin from the periphery of the superficial oxide layer 18, i.e., from the oxide bead 44. This has the effect of exposing oxide bead 44 to the oxide etch. However, the thickness of the bead and the length of the etch are such that, at the end of the etch, the superficial oxide layer is etched over its entire thickness and bead 44 is not removed, but only thinned to around a third of its initial thickness. For a bead 44 with a thickness of around two to three times the thickness of the superficial oxide layer 18, the length of the etch may reach one to two times the minimum etch time of superficial oxide layer 18. Thus, at the end of structuring of superficial oxide layer 18, substrate 10 has a central zone 21 essentially covered with oxide, and a peripheral zone 22 entirely covered with oxide. There is not discontinuity between central zone 21 and peripheral zone 22.

Figure 2G:
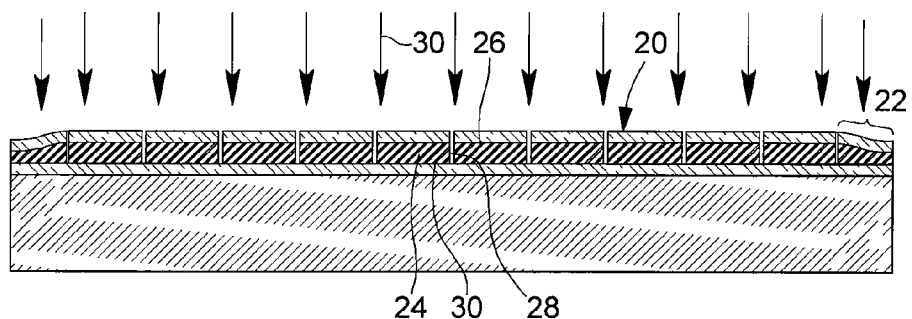
FIG. 2*g* illustrates one or more subsequent steps directed to cutting out the mechanical parts using etching in the manufacturing method in accordance with the present invention.

FIG. 2g: The superficial silicon layer 16 is etched through oxide mask 20, as far as embedded oxide layer 14, so as to cut out the mechanical silicon parts 24, including a top face 26, a flank 28, and a bottom face 30. The etch method is similar to the method used for the state of the art mechanical part manufacturing method.

Unlike the situation in the standard mechanical part manufacturing method, peripheral zone 22, exposed to the plasma etch just like central zone 21, is covered with oxide. There is a chemical continuity between peripheral zone 22 and central zone 21. The plasma is consequently homogenous over the entire surface exposed to the plasma, and no interference in the etch will be observed. As a result, the parts next to peripheral zone 22 are in conformity, i.e., their flanks 28 are perpendicular to their top and bottom faces 26 and 30. There is no rejection linked to the geometry of the parts.

Figure 2H:
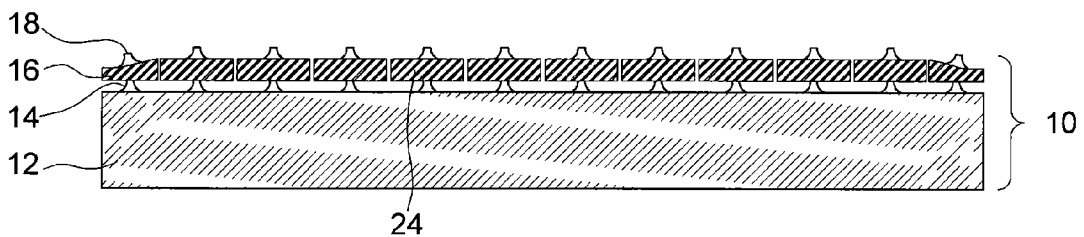
FIG. 2*h* illustrates one or more subsequent steps directed to removing the superficial oxide and embedded oxide layers in the manufacturing method in accordance with the present invention.

FIG. 2h: The superficial oxide layer 18 and embedded oxide layers 14 are removed by wet means, generally by etching in a concentrated hydrofluoric acid bath. Silicon parts 24 are thus released.

Thus, a method of manufacturing mechanical silicon parts from a silicon on insulator type substrate has been described. It goes without saying that this invention is not limited to the embodiment that has just been described and that various simple alterations and variants could be envisaged by those skilled in the art without departing from the scope of the invention as defined by the annexed claims. It will be noted, in particular, that the types of etch, oxidation and deposition methods mentioned are given by way of indication. Other types of methods well known to those skilled in the art could be employed in place of the methods cited, without departing from the scope of this invention.

It will also be noted that the method according to the invention can apply to varied materials, other than silicon. The method could, in particular, be transposed without any major adaptation to other semiconductor materials, such as germanium. It is also suited to quartz $SiO_2$, but in such case requires some adaptation. Indeed, quartz cannot be oxidised, and consequently the superficial oxide layer 18 must be replaced by a superficial layer of another material, able to resist a quartz etch step. This material is, for example, nitride or polysilicon. The superficial layer is formed by a deposition method rather than by a method of transforming the superficial quartz layer, such as oxidation. Bead 44 is also obtained by a selection deposition at the periphery of the nitride layer. The etch method uses chemistry able to etch quartz selectively relative to nitride or polysilicon.

What is claimed is:

1. A method of manufacturing mechanical or micro-mechanical parts of a first material able to be etched, from a substrate including at least one superficial layer of the first material, wherein the method includes the following steps:
    (a) forming a substantially uniform superficial layer of a second material at a surface of the at least one superficial layer of the first material, wherein the second material is able to resist a selective etch of the first material;
    (b) forming a bead of the second material at a periphery of the at least one superficial layer of the second material;
    (c) structuring the superficial layer of second material and the bead by a photolithographic process including an etch step of sufficient duration to etch the superficial layer of second material over the entire thickness thereof, wherein the etch step is insufficient to etch the bead over the entire thickness thereof, so as to obtain a first mask of the second material extending as far as the periphery of the at least one superficial layer of first material; and
    (d) cutting out mechanical or micro-mechanical parts, made of the first material through the first mask of the second material, by directional etching.

2. The method of manufacturing mechanical or micro-mechanical parts according to claim 1, wherein said first material is silicon.

3. The method of manufacturing mechanical or micro-mechanical parts according to claim 2, wherein a superficial oxide layer is formed at the surface of the superficial layer of first material by a full oxidation method of the superficial layer of first material.

4. The method of manufacturing mechanical or micro-mechanical parts according to claim 3, wherein said oxidation method is a thermal method.

5. The method of manufacturing mechanical or micro-mechanical parts according to claim 4, wherein said bead of the second material is an oxide bead disposed at a periphery of said superficial oxide layer and said oxide bead is formed by a selective oxidation method of the periphery of said superficial layer of first material.

6. The method of manufacturing mechanical or micro-mechanical parts according to claim 3, wherein said bead of the second material is an oxide bead disposed at a periphery of said superficial oxide layer and said oxide bead is formed by a selective oxidation method of the periphery of said superficial layer of first material.

7. The method of manufacturing mechanical or micro-mechanical parts according to claim 6, wherein said selective oxidation method of the periphery of said superficial layer of first material includes a step of applying a second mask to a central zone of said superficial oxide layer, followed by a thermal oxidation step, wherein said second mask is able to resist thermal oxidation.

8. The method of manufacturing mechanical or micro-mechanical parts according to claim 7, wherein said second mask is made by depositing a nitride layer on said superficial oxide layer, followed by structuring of said nitride layer so as to remove a periphery of said nitride layer.

9. The method of manufacturing mechanical or micro-mechanical parts according to claim 8, wherein the periphery of said nitride layer removed by structuring of said nitride layer leaves an exposed peripheral zone on said superficial oxide layer that is 2 to 5 millimeters in width.

10. The method of manufacturing mechanical or micro-mechanical parts according to claim 2, wherein said mechanical or micro-mechanical parts made of silicon are cut out of the first material by a plasma assisted etch method.

11. The method of manufacturing mechanical or micro-mechanical parts according to claim 1, wherein said second material is oxide.

12. The method of manufacturing mechanical or micro-mechanical parts according to claim 11, wherein a superficial oxide layer is formed at the surface of the superficial layer of first material by a full oxidation method of said superficial layer of first material.

13. The method of manufacturing mechanical or micro-mechanical parts according to claim 1, wherein the method further includes a step of:
(e) separating said mechanical or micro-mechanical parts from said substrate.

* * * * *